(12) United States Patent
Pounds et al.

(10) Patent No.: US 9,204,574 B1
(45) Date of Patent: Dec. 1, 2015

(54) VAPOR CHAMBER STRUCTURE

(71) Applicant: ADVANCED COOLING TECHNOLOGIES, INC., Lancaster, PA (US)

(72) Inventors: Daniel A. Pounds, Lancaster, PA (US); Richard W. Bonner, II, Columbia, MO (US)

(73) Assignee: Advanced Cooling Technologies, Inc., Lancaster, PA (US)

( * ) Notice: Subject to any disclaimer, the term of this patent is extended or adjusted under 35 U.S.C. 154(b) by 0 days.

(21) Appl. No.: 13/998,952

(22) Filed: Dec. 28, 2013

(51) Int. Cl.
*B23B 3/30* (2006.01)
*H05K 7/20* (2006.01)

(52) U.S. Cl.
CPC ............... *H05K 7/2029* (2013.01); *B23B 3/30* (2013.01)

(58) Field of Classification Search
CPC ............ B32B 7/10; B32B 7/08; B32B 7/045; B32B 3/30; H05K 7/2029
USPC .......... 220/918, 9.2, 9.4, 7; 428/99, 100, 101, 428/120, 139, 73
See application file for complete search history.

(56) References Cited

U.S. PATENT DOCUMENTS

| | | | |
|---|---|---|---|
| 4,039,708 A * | 8/1977 | Okada | 428/73 |
| 6,367,128 B1 * | 4/2002 | Galkiewicz et al. | 24/585.1 |
| 7,180,179 B2 | 2/2007 | Mok | |
| 7,369,410 B2 | 5/2008 | Chen | |
| 7,545,648 B2 | 6/2009 | Karidis | |
| 7,645,641 B2 | 1/2010 | Webb | |
| 2003/0003271 A1 * | 1/2003 | Bykov et al. | 428/139 |
| 2003/0190451 A1 * | 10/2003 | Baker et al. | 428/99 |

* cited by examiner

*Primary Examiner* — Stephen Castellano
(74) *Attorney, Agent, or Firm* — McNees Wallace & Nurick LLC

(57) ABSTRACT

A vapor chamber structure which locks the upper planar plate lid to the lower planar plate base without the need for brazing and prevents distortion of the surfaces from internal pressure in the chamber. The basic structure has parallel rows of latching structures on the interior surfaces of the upper planar plate lid and the lower planar plate base. Each row of latching structures has a cross section in the shape the letter "L" with the top of the "L" attached to the interior surface of the lid so that the horizontal sections of the "L"s face the lower planar base plate when the chamber is assembled.

3 Claims, 4 Drawing Sheets

VAPOR CHAMBER STRUCTURE

BACKGROUND OF THE INVENTION

This invention deals generally with vapor chambers and more specifically with a structure for a vapor chamber which is easily adaptable to high volume production.

Vapor chambers are often used in cooling electronic circuitry, but they are typically limited in operating temperature by the boiling point of the working fluid. If the boiling point of the working fluid is exceeded, the vapor pressure will be beyond atmospheric pressure thus creating positive pressure on the inside of the vapor chamber. If this happens, the planarity of the vapor chamber envelope can be compromised and in extreme cases will cause the envelope to rupture releasing the working fluid and destroying the device and possibly the adjacent electronics. A common means of overcoming this limitation is by bonding a pillar-like support structure between the upper planar plate lid of the vapor chamber and the bottom base plate, typically by soldering or brazing. This technique can overcome the temperature limitation of the vapor chamber; however it may not be practical, especially in high volume production. Consistency between braze joints can be difficult to achieve, because it is very dependent on the temperature uniformity of the parts undergoing the brazing process. This is especially true when an internal wick structure is in close proximity to the braze joint, and acts as wick for the liquid braze. This ultimately damages the wick structure and also compromises the braze joint.

It would be very beneficial to have a system for assembling the vapor chamber that maintained the planar structure of the upper lid and the base plate by preventing their distortion, but was also simple to assemble and did not interfere with the action of the wick.

SUMMARY OF THE INVENTION

The present invention is a vapor chamber that includes a mechanical latching structure which eliminates the need for soldering, brazing, or similar procedures. Instead, both the upper lid and the base plate have pillar like structural protrusions that interlock and fulfill all the requirements of the vapor channel.

The basic structure has parallel rows of latching structures on the interior surfaces of both the upper planar plate lid and the planar base plate. On the lid each row of latching structures has a cross section in the shape the letter "L" with the top of the "L" attached to the interior surface of the lid so that the horizontal sections of the "L"s in each row are aligned and face the lower planar base plate when the chamber is assembled.

The base plate also has parallel rows of latching structures on the interior surface. These structures have cross sections that are essentially solid blocks with grooves running along the bottom of one side and the grooves of all the structures in each row are aligned.

The spacing between the two sets of rows is the same, and the horizontal sections of the "L"s on the lid face the latching structure grooves on the base. Furthermore, the horizontal sections of the "L"s on the lid are of a size and located at a height that permits them to slide and fit tightly into the grooves in the rows of latching structures on the base. The plates are thereby locked together after assembly with virtually no possibility of distortion.

DETAILED DESCRIPTION OF THE INVENTION

Figure 1:
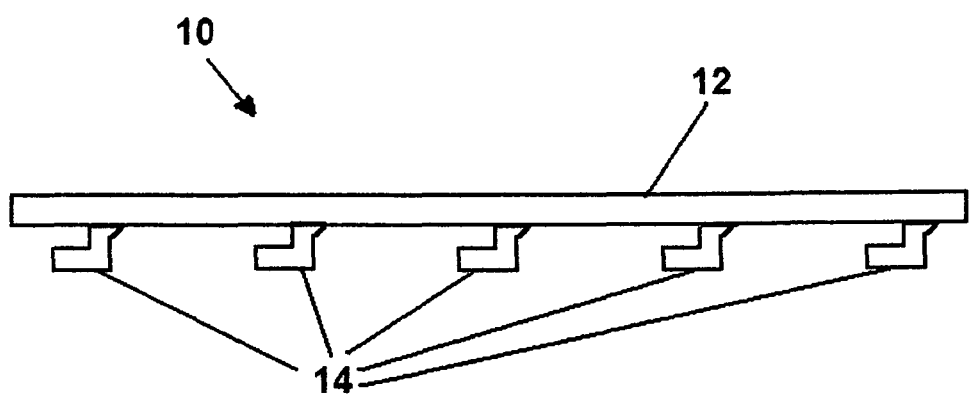
FIG. 1 is an end view of the upper planar plate lid of the vapor chamber of the preferred embodiment of the invention.

FIG. 1 is an end view of the upper planar plate lid 12 of vapor chamber 10 of the preferred embodiment of the invention.

Figure 3:
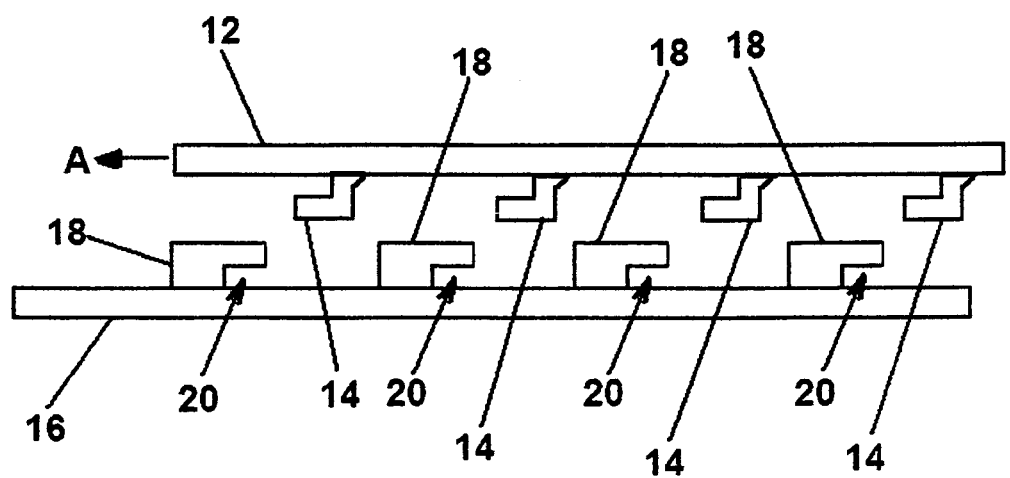
FIG. 3 is an end view of the components of the preferred embodiment of the vapor chamber of the invention with the upper planar plate lid aligned with the planar base plate in preparation for assembly.

On lid 12, each row has latching structures 14 with cross sections in the shape the letter "L", and the top of each "L" is attached to the interior surface of lid plate 12 so that the horizontal sections of the "L"s face lower planar base plate 16 when vapor chamber 10 is being assembled as shown in FIG. 3.

Figure 2:
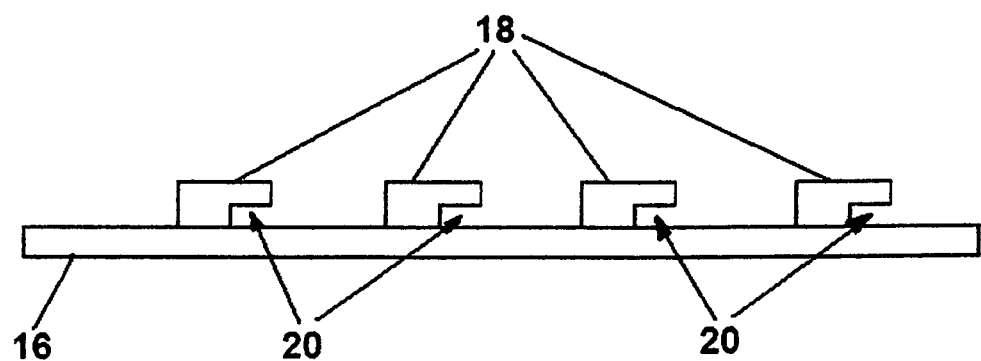
FIG. 2 is an end view of the planar base plate of the vapor chamber of the preferred embodiment of the invention.

FIG. 2 is an end view of planar base plate 16 of the vapor chamber of the preferred embodiment of the invention.

Base plate 16 also has parallel rows of latching structures 18 on the interior surface. Structures 18 have cross sections that are essentially solid blocks with grooves 20 running along the bottom of one side of each block 18, and grooves 20 of all the blocks in each row are aligned and parallel with the grooves in the other rows.

The spacings between the sets of structures 14 on lid 12 and the spacings between structures 18 on base 16 are the same, and the horizontal sections of the "L"s on lid 12 face the grooves on latching structures 18 on base 16. Furthermore, the horizontal sections of the "L"s on lid 12 are located at a height that permits them to fit into grooves 20 in latching structures 18 on base 16. However, the horizontal sections of structures 14 are of a size that they fit tightly into grooves 20. The plates are thereby locked together after assembly with virtually no possibility of distortion.

Figure 4:
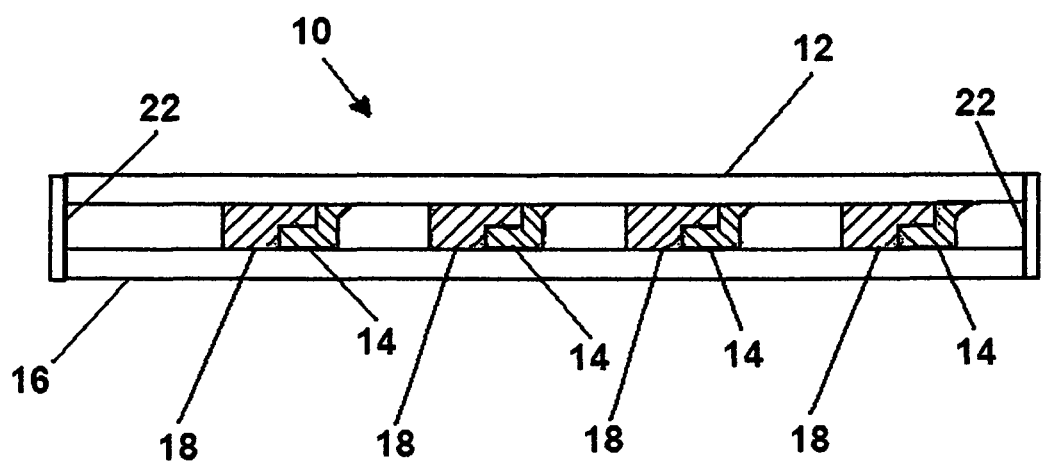
FIG. 4 is a cross sectional end view of the preferred embodiment of the complete vapor chamber of the invention with the upper planar plate lid assembled onto the planar base plate as seen from inside of the sealed enclosure of the vapor chamber.

FIG. 3 is an end view of the components of the preferred embodiment of vapor chamber 10 of the invention with upper planar plate lid 12 aligned with planar base plate 16 in preparation for assembly. The subsequent assembly process involves two simple steps. The first step is to move lid 12 toward base plate 16 so that latching structures 14 are in the spaces between latching structures 18 on base plate 18 and aligned with grooves 20. The assembly process is completed by the next step, which is to move lid 12 in direction A, thus placing the horizontal sections of structures 14 into grooves 20 on base 16 as shown in FIG. 4. It should be appreciated that the sizes of the horizontal sections of structures 14 and of grooves 20 are selected so that when assembled the parts of structure 14 fit tightly into grooves 20, and that will prevent later separation.

FIG. 4 is a cross sectional end view of the preferred embodiment of complete vapor chamber 10 of the invention with upper planar plate lid 12 assembled onto planar base plate 16 as seen from inside of the sealed enclosure of the vapor chamber 10. Two sidewalls 22 that help form the sealed enclosure are also shown.

The present invention thereby provides a vapor chamber that includes a mechanical latching structure which eliminates the need for soldering, brazing, or similar procedures, and can be easily adapted to high volume production.

It is to be understood that the forms of this invention as shown are merely preferred embodiments. Various changes may be made in the function and arrangement of parts; equivalent means may be substituted for those illustrated and described; and certain features may be used independently from others without departing from the spirit and scope of the invention as defined in the following claims. The sizes of the various parts and the shapes of the interlocking parts can be different. For example, instead of the "L" shapes of latching structures 14 and the grooves of latching structures 18 of the preferred embodiment, it is possible to use other configurations such as cylinders on one latching structure and matching holes on the other latching structure.

What is claimed as new and for which Letters Patent of the United States are desired to be secured is:

1. A vapor chamber comprising:
    a planar lid with first support structures attached to and protruding from a first planar surface, with said first support structures spaced apart from each other by a first distance and arranged in parallel rows that are spaced apart by a second distance;
    first interlocking fixtures attached to said first support structures, the first interlocking fixtures extending from the first support structures to form first grooves which are dimensioned to receive second interlocking fixtures therein, the first interlocking fixtures and the first support structures forming first solid blocks;
    a planar base with second support structures attached to and protruding from a second planar surface, with the second support structures spaced apart by the first distance and arranged in parallel rows that are spaced apart by the second distance;
    the second interlocking fixtures attached to the second support structures, the second interlocking fixtures extending from the second support structures to form second grooves which are dimensioned to receive the first interlocking fixtures therein, the second interlocking fixtures and the second support structures forming second solid blocks;
    the first interlocking fixtures are dimensioned to fit tightly into the second grooves causing the first interlocking fixtures to be tightly maintained in the second grooves to prevent unwanted separation of the planar lid from the planar base;
    wherein said second distance is large enough to permit the parallel rows of the first support structures with the first interlocking fixtures to fit between the parallel rows of the second support structures with the second interlocking fixtures when the planar lid is moved toward the planar base; and
    wherein the first interlocking fixtures interlock with the second interlocking fixtures when the planar lid and the planar base are positioned to permit the first interlocking fixtures and the second interlocking fixtures to contact each other to lock the planar lid to the planar base to maintain the planar structure of the planar lid and the planar base by preventing their distortion from positive pressure on the first planar surface of the planar lid and on the second planar surface of the planar base of the vapor chamber caused when pressure from the vapor chamber exceeds atmospheric pressure.

2. A vapor chamber as recited in claim 1, wherein the first interlocking fixtures have L-shaped cross sections, with the top of the first interlocking feature attached to the first planar surface of the planar lid.

3. A vapor chamber as recited in claim 2, wherein the first planar surface is an interior surface of the planar lid.

\* \* \* \* \*